United States Patent [19]

Fletcher et al.

[11] Patent Number: 5,293,303

[45] Date of Patent: Mar. 8, 1994

[54] CIRCUIT BOARD INJECTOR/EJECTOR DEVICE FOR A CIRCUIT BOARD ENCLOSURE

[75] Inventors: Neil C. Fletcher, Southampton; David Horne, Winchester, both of England

[73] Assignee: BICC Public Limited Company, London, England

[21] Appl. No.: 987,619

[22] Filed: Dec. 9, 1992

[30] Foreign Application Priority Data

Dec. 11, 1991 [GB] United Kingdom ............... 9126235

[51] Int. Cl.$^5$ ............................................. H05K 7/14
[52] U.S. Cl. ....................................... 361/798; 361/609; 361/610; 361/726; 361/730; 361/796; 211/41; 439/31; 439/64; 439/152
[58] Field of Search ............... 361/339, 340, 392, 391, 361/394, 399, 413, 415, 8, 609, 610, 728, 730, 726, 785, 798, 796; 439/31, 152-160, 372, 476, 483, 64; 211/41

[56] References Cited

U.S. PATENT DOCUMENTS

| | | | |
|---|---|---|---|
| 3,767,974 | 10/1973 | Donovan, Jr. et al. | 317/101 DH |
| 3,784,954 | 1/1974 | Grimm et al. | 339/17 LM |
| 3,798,507 | 3/1974 | Damon et al. | |
| 3,853,379 | 12/1974 | Goodman et al. | 339/75 MP |
| 3,952,232 | 4/1976 | Coules . | |
| 4,064,551 | 12/1977 | Lightfoot . | |
| 4,083,616 | 4/1978 | McNiece et al. | 339/45 M |
| 4,178,051 | 12/1979 | Kocher et al. | 339/45 M |
| 4,183,602 | 1/1980 | Meunier et al. . | |
| 4,233,646 | 11/1980 | Leung et al. . | |
| 4,241,966 | 12/1980 | Gomez | 339/45 M |
| 4,243,283 | 1/1981 | MeSparran . | |
| 4,313,150 | 1/1982 | Chu | 361/339 |
| 4,421,372 | 12/1983 | Golden | 339/75 MP |
| 4,564,250 | 1/1986 | Klein et al. | 339/14 R |
| 4,602,835 | 7/1986 | Bauer et al. . | |
| 4,606,591 | 8/1986 | Bloch . | |
| 4,648,009 | 3/1987 | Beun et al. . | |
| 4,699,594 | 10/1987 | Assel et al. . | |
| 4,902,239 | 2/1990 | Schindler . | |

FOREIGN PATENT DOCUMENTS

| | | |
|---|---|---|
| 097228 | 1/1984 | European Pat. Off. . |
| 191968 | 8/1986 | European Pat. Off. . |
| 305681 | 3/1989 | European Pat. Off. . |
| WO85/05243 | 11/1985 | PCT Int'l Appl. . |
| 2231726 | 11/1990 | United Kingdom . |

Primary Examiner—Leo P. Picard
Assistant Examiner—Young Whang
Attorney, Agent, or Firm—Oliff & Berridge

[57] ABSTRACT

A circuit board injector/ejector device for use with a circuit board to be accommodated in a rack housed in an enclosure comprises a body adapted to be secured to a front plate secured to the circuit board and a lever pivotally mounted on the body. The device is adapted to assist in providing the force necessary to effect a multiplicity of pin and socket connections at the rear of the circuit board when the circuit board is introduced into a rack and to assist in providing the force necessary to effect disconnection of the multiplicity of pin and socket connections at the rear of the circuit board when the circuit board is withdrawn from the rack. The lever has passing therethrough a fixing screw which, when the multiplicity of pin and socket connections at the rear of the circuit board have been made and withdrawal of the circuit board from the rack is prevented by cooperating surfaces of the lever and an adjacent elongate member of the rack, is adapted to screw into a tapped hole in the body to prevent pivotal movement of the lever.

4 Claims, 5 Drawing Sheets

CIRCUIT BOARD INJECTOR/EJECTOR DEVICE FOR A CIRCUIT BOARD ENCLOSURE

BACKGROUND OF THE INVENTION

This invention relates to cabinets, cases and other enclosures in which electrical and/or electronic apparatus is mounted on racks, trays or other supports housed in the enclosure. The invention is particularly concerned with enclosures of this kind in which circuit boards are accommodated in racks which are housed in the enclosure and which generally comprise a plurality of mutually spaced pairs of opposed guide rails into any pair of which opposed edges of a circuit board can be slid from the front of the rack, as the circuit board is slid fully home one or more than one edge connector mounted on the circuit board at or near its rear edge effecting electrical connection with a connector or connectors directly or indirectly carried by a backplane at the rear of the enclosure.

With a view to facilitating insertion of a circuit board into, and withdrawal of a circuit board from, a pair of opposed guide rails of the rack, it is the general practice to secure to the front edge of the circuit board, i.e. the trailing edge of the board as it is slid into the rails, a substantially rectangular flat plate, hereinafter referred to as the front plate, which serves as a handle. Neighbouring edges of the front plates of adjacent circuit board when slid fully home in their pairs of guide rails will lie close together so that when circuit boards are accommodated in all the pairs of guide rails of the rack, the front plates of the boards together present a substantially flat surface at the front of the enclosure.

When a circuit board has been slid fully home in its pair of guide rails, it is also the general practice to detachably secure the board in position and this is usually effected by means of fixing screws which pass through opposite ends of the front plate of the board and screw into tapped holes in opposed elongate members which extend transversely across the front of the enclosure adjacent the front ends of the pairs of guide rails. Each elongate member is customarily an extrudate of metal or metal alloy and, for reasons of ease of manufacture and cost, generally the tapped holes for reception of the fixing screws of the front plates of the circuit boards are formed in and mutually spaced along the length of a strip of metal or metal alloy which is separately formed with respect to each extrudate and which is removably housed in a pair of opposed grooves in said extrudate.

Where the edge connector or edge connectors at the rear edge of a circuit board effect a multiplicity of pin and socket connections with a connector or connectors of a backplane, a substantial force is necessary both to effect these connections and, when required, to disconnect the edge connector or connectors from the connector or connectors of the backplane and there have been many proposals to provide, near each end of the front edge of a circuit board or of a front plate secured thereto, a lever which is directly or indirectly pivotably secured to the circuit board and which, when pivoted in one direction co-operates with a "push-in" surface on the adjacent elongate member extending transversely across the front of the enclosure to assist in providing the force necessary to effect said multiplicity of pin and socket connections at the rear of the circuit board and, when said connections are made, will not permit withdrawal of the circuit board unless the lever is pivoted in the opposite direction and which, when the lever is pivoted in the opposite direction co-operates with a "push-out" surface on said adjacent elongate member to assist in providing the force necessary to disconnect said edge connector or connectors from the connector or connectors of the backplane.

It is an object of the present invention to provide, for use with a circuit board to be accommodated in a rack housed in an enclosure and to be electrically connected to a backplane at the rear thereof, an improved device for assisting in insertion of a circuit board in, and extraction of a circuit board from, said enclosure, said improved device hereinafter, for convenience, being referred to as "a circuit board injector/ejector device".

According to the invention, the improved circuit board injector/ejector device comprises a body adapted to be secured to a circuit board or to a front plate secured thereto and a lever pivotally mounted on said body, which lever, when pivoted in one direction, has a surface adapted to co-operate with a "push-in" surface on an adjacent elongate member extending transversely across the front of the rack to assist in providing the force necessary to effect a multiplicity of pin and socket connections at the rear of the circuit board to which the device is directly or indirectly secured, and has at least one surface which, when said connections have been made, is adapted to co-operate with a surface on said adjacent elongate member to prevent withdrawal of the circuit board from the rack unless the lever is pivoted in the opposite direction and which lever, when pivoted in said opposite direction, has another surface adapted to co-operate with a "push-out" surface on said adjacent elongate member to assist in providing the force necessary to effect disconnection of said multiplicity of pin and socket connections at the rear of the circuit board, wherein the lever has passing therethrough a fixing screw which, when the multiplicity of pin and socket connections at the rear of the circuit board have been made and withdrawal of the circuit board from the rack is prevented by said co-operating surfaces of the lever and adjacent elongate member, is adapted to screw into a tapped hole in the body of the device or in the front plate of the circuit board to prevent pivotal movement of the lever.

By providing for clamping of the lever of the improved circuit board injector/ejector device when the multiplicity of pin and socket connections at the rear of the circuit board to which the device is directly or indirectly secured have been made, the requirement to secure each end of the front plate of the circuit board to the adjacent transversely extending elongate member by a fixing screw which screws into a tapped hole in a separately formed strip removably accommodated in the adjacent elongate member is avoided. As a consequence, it is unnecessary to provide, in each adjacent elongate member, a separately formed strip having a plurality of tapped holes mutually spaced along its length, thereby representing a substantial savings in cost. Moreover, since such separately formed strips with tapped holes are rendered superfluous by the improved circuit board injector/ejector device of the present invention, the improved device is especially suitable for use in conjunction with the improved elongate member which has mutually spaced along its length guides for reception of locating pins protruding from the rear faces of face plates of circuit boards and which is the subject of co-pending patent application Ser. No: 07/987,804 filed on the same day as the present application.

The invention also includes a circuit board for accommodating in a rack housed in an enclosure and for effecting electrical connection to a backplane at the rear of the enclosure, which circuit board comprises at least one edge connector mounted on the circuit board at or near its rear edge for effecting a multiplicity of pin and socket electrical connections with a connector directly or indirectly carried by a backplane at the rear of the enclosure, a substantially rectangular front plate secured to the front edge of the circuit board and, at or near each end of the front plate, an improved circuit board injector/ejector device as hereinbefore described.

BRIEF DESCRIPTION OF THE DRAWINGS

The invention is further illustrated by a description, by way of example, of one preferred circuit board injector/ejector device for securing to an end of the front plate of a circuit board with reference to the accompanying drawings, in which.

DESCRIPTION OF THE PREFERRED EMBODIMENTS

Figure 1:
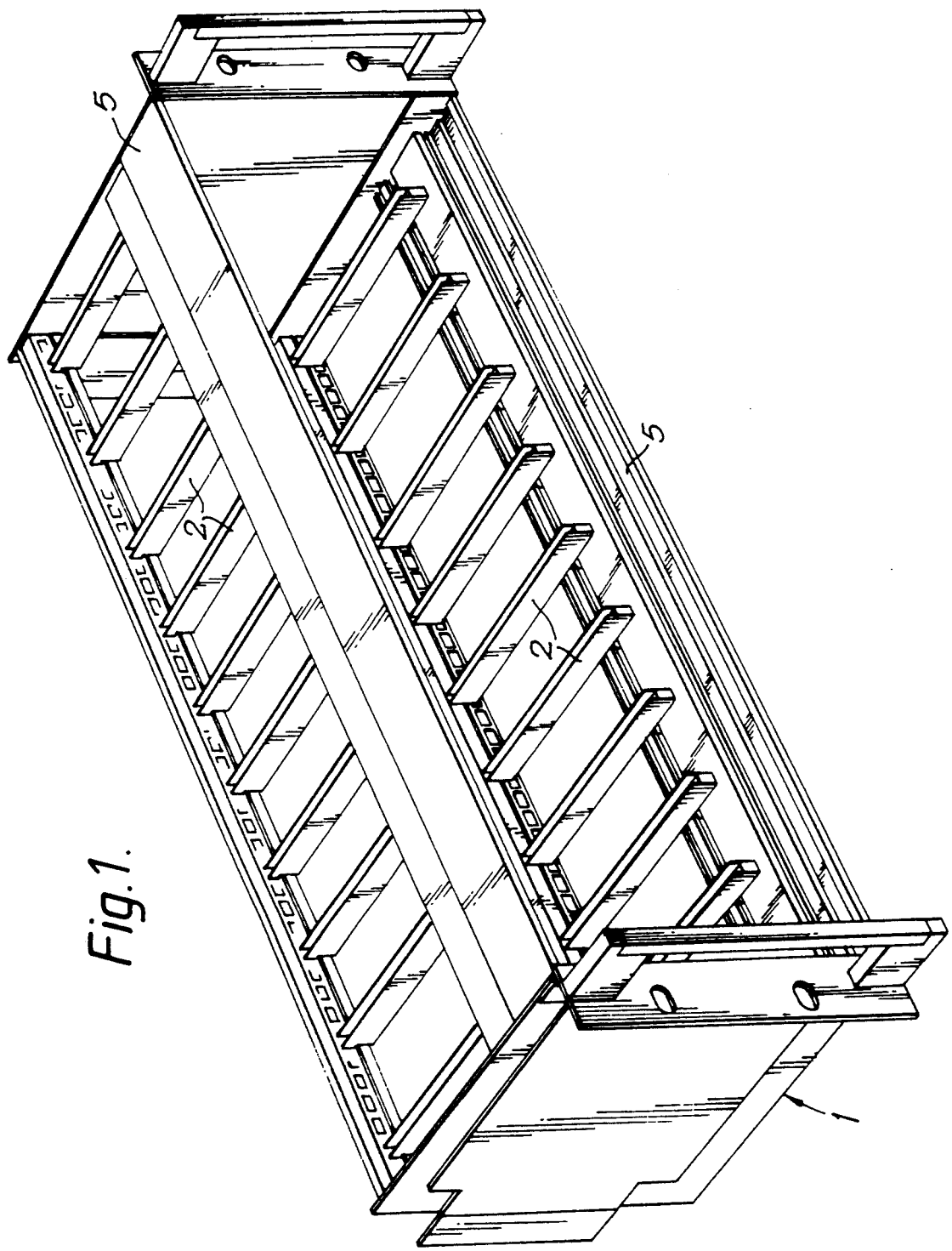
FIG. 1 is a perspective view a rack for accommodating circuit boards and housing in the enclosure.
Figure 2:
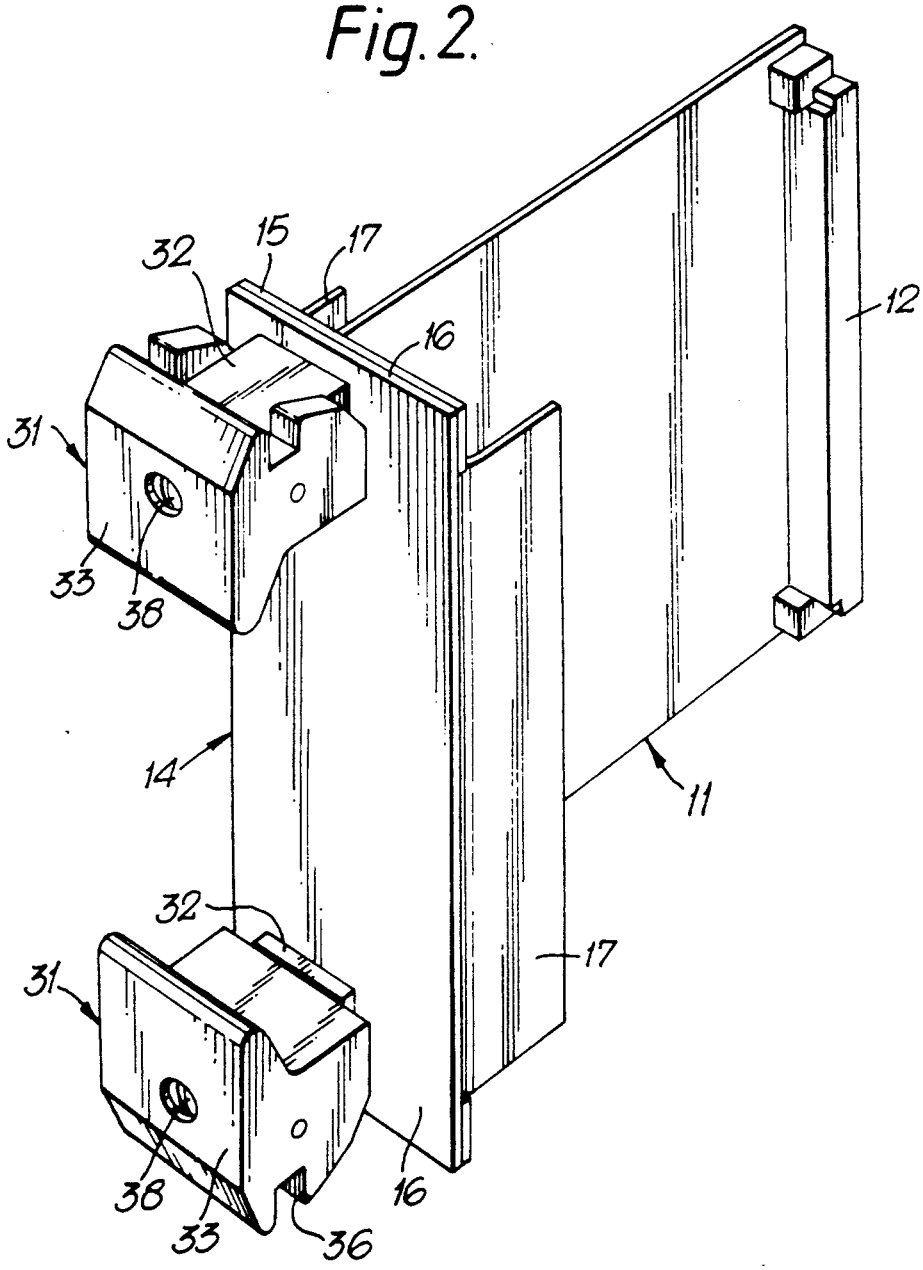
FIG. 2 is a perspective view of a circuit board for accommodating in the rack shown in FIG. 1.
Figure 3:
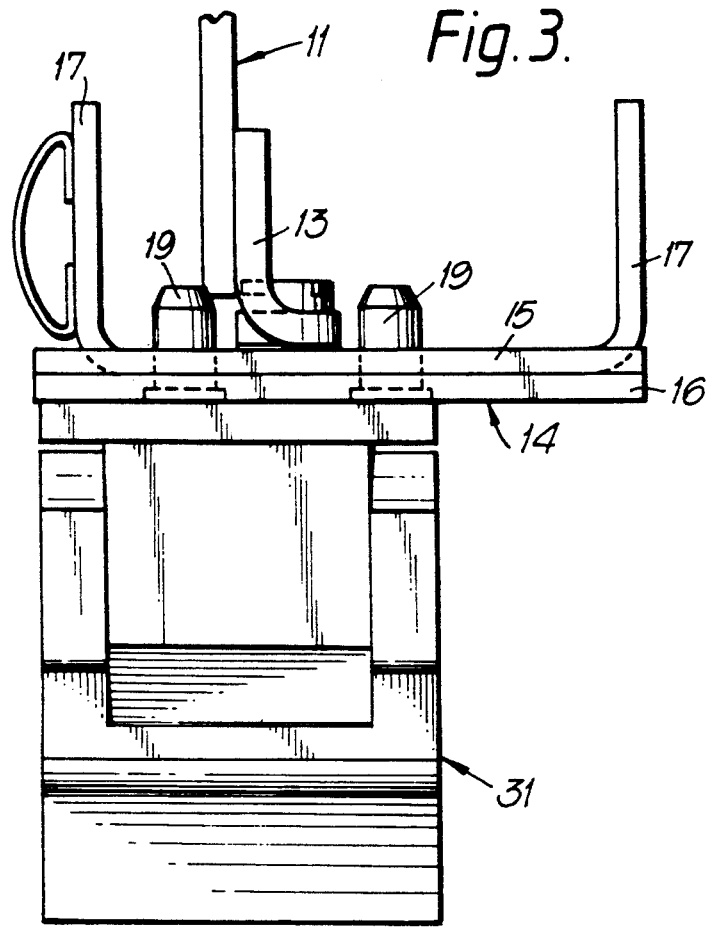
FIG. 3 is a fragmental view from above of the circuit board shown in FIG. 2, and FIGS. 4 to 6 are fragmental side views, partly in section and partly in elevation, of one end of the front plate of the circuit board shown in FIGS. 2 and 3 with the preferred circuit board injector/ejector device mounted thereon, FIG. 4 showing use of the device to provide the force necessary to effect a multiplicity of pin and socket connections at the rear of the circuit board, FIG. 5 showing locking of the device to prevent withdrawal of the circuit board and FIG. 6 showing use of the device to provide the force necessary to disconnect the multiplicity of pin and socket connections at the rear of the circuit board.

Referring to FIGS. 1 to 3, the rack 1 comprises a plurality of mutually spaced pairs of opposed horizontal guide rails 2 into any pair of which opposed upper and lower edges of a circuit board 11 can be slid from the front of the rack. In the rear of an enclosure in which the rack is housed would be disposed a plurality of connectors (not shown) directly or indirectly carried by a backplane, each of which connectors has in its front face a multiplicity of sockets. Extending transversely across the front of the rack 1 along each of its upper and lower edges is an extrudate 5 of metal alloy having throughout its length a pair of opposed grooves 6 (FIGS. 4 to 6) in which an elongate metal member 7, separately formed with respect to the extrudate, is removably housed and having throughout its length a flange 8 which extends forwardly from the front face of the rack 1 and in which a channel 9 extends throughout the length of the flange. Each elongate metal member 7 has mutually spaced along its length a multiplicity of guides 10, the purpose of which will be explained hereinafter.

A circuit board 11 for accommodating in the rack 1 has mounted on the board at or near its rear edge an edge connector 12 from which protrudes a multiplicity of pins for effecting pin and socket connections with the multiplicity of sockets of a connector at the rear of the aforesaid enclosure. Secured to the front edge of the circuit board 11 by brackets 13 is a rectangular front plate 14 which is of a composite form comprising two flat panels secured face-to-face, the rear or inner panel 15 being of electrically conductive metal or metal alloy and the front or outer panel 16 being of electrically insulating material. The inner panel 15 of the composite front plate 14 has extending along a major part of the length of each of its side edges a flange 17 which is integral with and extends rearwardly from the panel. Electrically connected to the outer face of one of the flanges 17 is a resilient electrical contact 18 which will effect electrical connection with a flange of the inner panel 15 of the composite front plate 14 of the adjacent circuit board 11 when one of the adjacent circuit boards is already accommodated in the rack 1 and the other of the adjacent circuit boards is slid fully home into its pair of guide rails 2. To prevent any tendency for the resilient contact 18 to urge the circuit board 11 transversely to its direction of sliding motion to such an extent as to render difficult the effecting of the multiplicity of pin and socket connections at the rear of the enclosure in which the rack is housed, the composite front plate 14 has protruding rearwardly from each of its upper and lower ends a pair of transversely spaced rigid pins 19 which are adapted to engage in guides 10 of the elongate metal member 7 to locate the composite front plate positively with respect to the extrudate 5 as the circuit board 11 is slid fully home in a pair of opposed guide rails 2.

Figure 4:
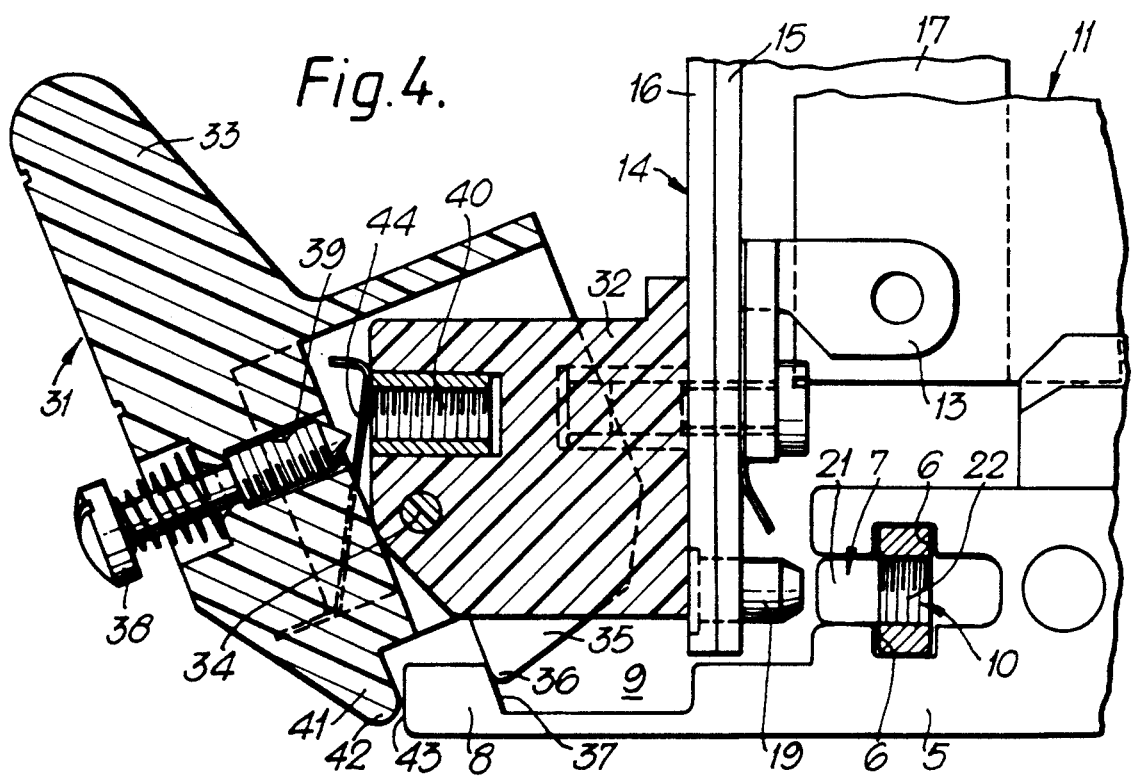
Figure 5:
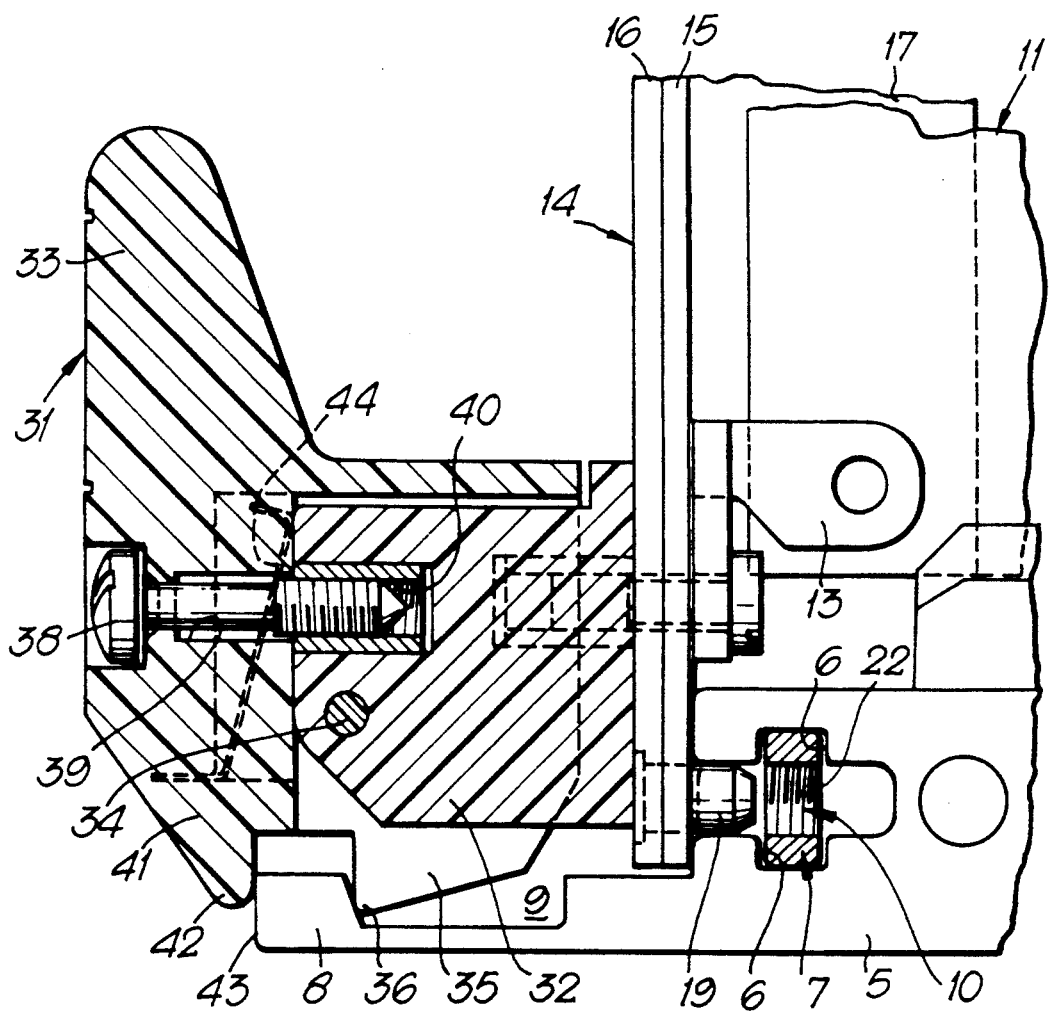
Figure 6:
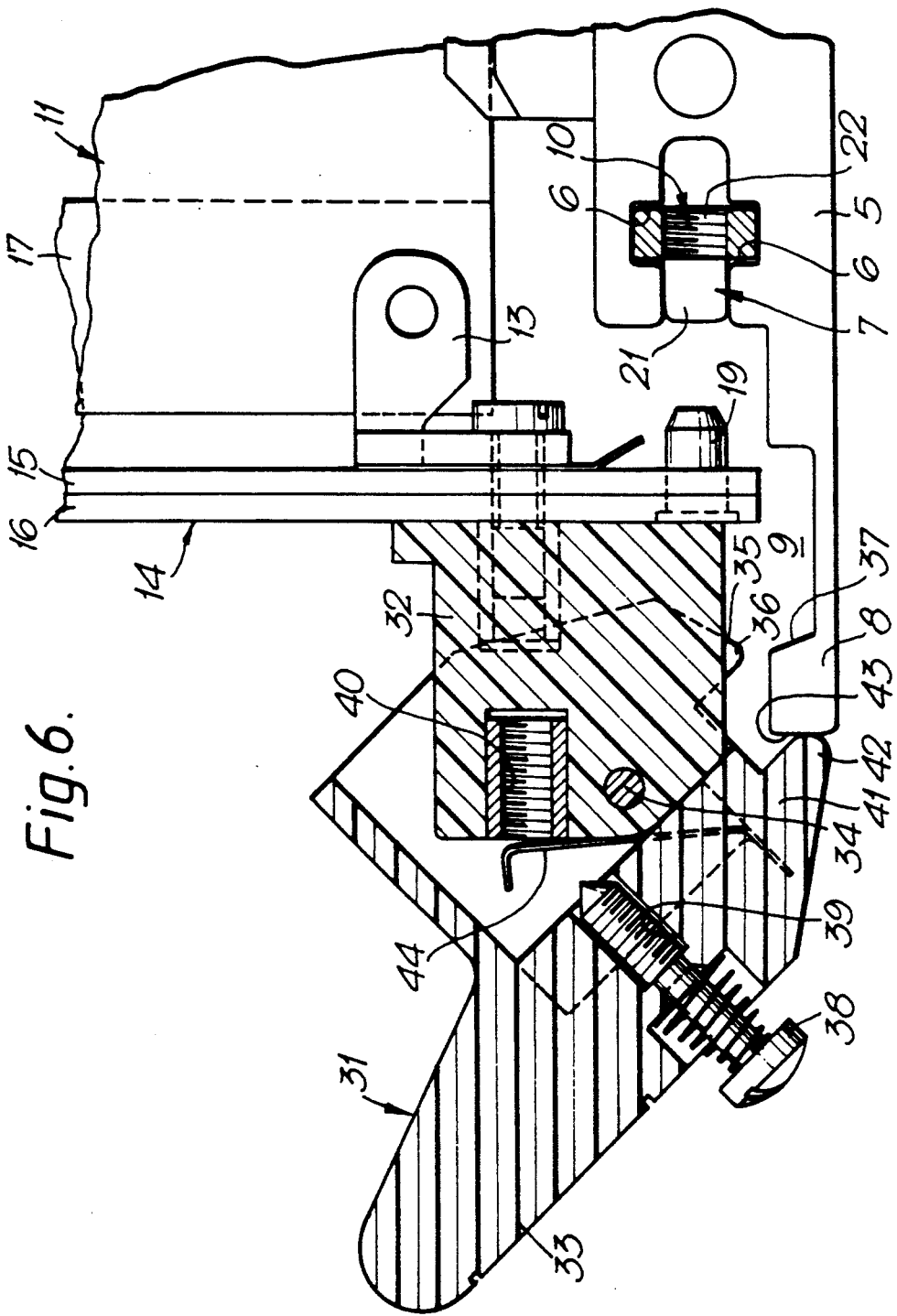

As will be seen on referring to FIGS. 4 to 6, to accommodate locating pins 19 having any length within a limited range of lengths of locating pins, each elongate metal member 7 is of T-shaped transverse cross-section with opposite ends of the head of the T removably housed in the opposed grooves 6 in the associated extrudate 5. The limb of each T-shaped elongate member 7 has throughout the length of the member a plurality of mutually spaced castellations 21 and the head of each T-shaped elongate member has throughout the length of the member a plurality of mutually spaced holes 22, each in axial alignment with a gap between two adjacent castellations in the limb. Each guide 10 for reception of a locating pin 19 comprises in part a gap between two adjacent castellations 21 in the limb of the T-shaped elongate member and in part a hole 22 extending throughout the thickness of the head of the T-shaped elongate member.

At or near each end of the composite front plate 14 is a preferred circuit board injector/ejector device 31 comprising a body 32 which is fixedly secured to the composite front plate and a lever 33 which is pivotally mounted on the body about a horizontal pivotal axis 34. The lever 33 has a tongue 35 which, when the lever is pivoted in a direction towards the front face of the composite front face of the composite front plate 14, will protrude beyond the body 32 so that a rounded surface 36 on the tongue will bear against an inclined side face 37 of the channel 9 in the flange 8 of the associated extrudate 5, which inclined side face constitutes the "push-in" surface of the extrudate. The lever 33 also has a fixing screw 38 which is so screw threaded in a tapped hole 39 in the lever that the fixing screw cannot be readily removed therefrom and which is adapted to screw into a tapped hole 40 in the body 32. Projecting from the outer end of the lever 33 is a finger 41 having a rounded end 42 which, when the lever is pivoted in a direction away from the front face of the composite front plate 14, will bear against the front end face 43 of the flange 8 of the associated extrudate 5, which front end face constitutes the "push-out" surface of the extrudate. A leaf spring 44 accommodated in the device urges the pivotally mounted lever 33 in a direction away from the front face of the composite front plate 14.

Referring specifically to FIGS. 4 to 6, when the circuit board 11 is to be accommodated in the rack 1 housed in an enclosure, the leading ends of the upper and lower edges of the circuit board 11 are introduced into a pair of opposed guide rails 2 and the circuit board is slid between the guide rails until the locating pins 19 protruding rearwardly from the composite front plate 14 initially engage in guides 10 of the T-shaped elongate members 7. The levers 33 at the ends of the composite front plate 14 are then pivoted in a direction towards the front face of the composite front plate against the action of the leaf springs 44 so that the rounded surfaces 36 of the tongues 35 protruding beyond the bodies 32 bear against and co-operate with the "push-in" surfaces constituted by the inclined side faces 37 of the channels 9 in the flanges 8 of the extrudates 5 to assist in providing the force necessary to effect the multiplicity of pin and socket connections between the edge connector 12 at the rear of the circuit board 11 and a connector at the rear of an enclosure in which the rack 1 is housed. When the circuit board 11 has been slid fully home and the multiplicity of pin and socket connections has been effected, the rounded surfaces 36 of the tongues 35 bearing against the inclined side faces 37 of the channels 9 prevent withdrawal of the circuit board 11 from the enclosure. The fixing screws 38 are then screwed into the tapped holes 40 in the bodies 32 to prevent pivotal movement of the levers 33.

When the circuit board 11 is to be withdrawn from the rack 1, the fixing screws 38 are unscrewed from the tapped holes 40 in the bodies 32 and the levers 33 are pivoted in a direction away from the front face of the composite front plate 14 so that the rounded ends 42 of the fingers 41 bear against and co-operate with the "push-out" surfaces constituted by the front end faces 43 of the flanges 8 of the extrudates 5 to assist in providing the force necessary to effect disconnection of the multiplicity of pin and socket connections at the rear of the circuit board and, since the tongues 35 are no longer engaged in the channels 9, the circuit board can then be readily slid outwardly from the rack 1.

What we claim as our invention is:

1. A circuit board injector/ejector device for injecting and ejecting a circuit board into a rack, the rack housed in an enclosure having a backplane, to electrically connect a rear edge of the circuit board to the backplane, the circuit board injector/ejector device comprising:
   a body secured to a front plate, the front plate secured to a front edge of the circuit board;
   a lever pivotally mounted on said body, said lever pivotable in both a first direction and a second direction opposite to the first direction, the lever having at least a first surface and a second surface;
   an elongated member extending transversely across the rack, the elongated member having a push-in surface and a push-out surface, the lever engagable with said elongated member;
   wherein when the lever is pivoted in the first direction, the first surface of the lever engages with the push-in surface on the elongated member to connect the circuit board to the backplane by injecting a plurality of pins on one of said rear edge of said circuit board and said backplane into a plurality of sockets on the other one of said rear edge of said circuit board and said backplane;
   the lever having at least one surface engaging a surface on said elongated member when said plurality of pins have been injected into said plurality of sockets to prevent withdrawal of said circuit board from the rack unless the lever is first pivoted in the second direction;
   the second surface of the lever engaging with the push-out surface on said elongated member to eject said plurality of pins from said plurality of sockets when the lever is pivoted in the second direction;
   the body of the device having a tapped hole; and
   a fixing screw insertable through the lever into said hole when the plurality of pins have been injected into said plurality of sockets, the fixing screw threadably insertable into said tapped hole to prevent pivotal movement of the lever.

2. The circuit board injector/ejector device of claim 1, further comprising means for preventing the removal of the fixing screw from the lever.

3. The circuit board injector/ejector device of claim 1, further comprising spring means for urging the lever in said second direction.

4. A circuit board removably injectable into a rack, the rack housed in an enclosure, the circuit board electrically connectable to a backplane at a rear portion of the enclosure, the circuit board comprising:
   at least one edge connector mounted on the circuit board near a rear edge of the circuit board and connectable to a connector carried by the backplane;
   an elongated member extending transversely across the rack, the elongated member having a push-in surface and a push-out surface;
   a front plate secured to a front edge of the circuit board; and
   a circuit board injector/ejector device comprising:
   a board secured to the front plate;
   a lever pivotally mounted on the body, said lever pivotable in both a first direction and a second direction opposite to the first direction, the lever engagable with said elongated member;
   wherein when the lever is pivoted in the first direction, a first surface of the lever engages with the push-in surface on the elongated member to connect the circuit board and the backplane;
   the lever having at least one surface engaging with a surface on said elongated member when said circuit board is connected to said backplane to prevent withdrawal of said circuit board from the enclosure unless the lever is first pivoted in the second direction;
   the second surface of the lever engaging with the push-out surface on said elongated member to disconnect said circuit board from said backplane when the lever is pivoted in the second direction;
   the body of the circuit board injector/ejector device having a tapped hole; and
   the lever of the circuit board injector/ejector device having a fixing screw, the fixing screw threadably insertable into said tapped hole when the circuit board is connected to the backplane, the fixing screw preventing pivotal movement of the lever when threadably inserted into said tapped hole.

* * * * *